United States Patent [19]

Lienhard et al.

[11] Patent Number: 4,525,668

[45] Date of Patent: Jun. 25, 1985

[54] SYSTEM FOR MEASURING ELECTRICAL OUTPUT OR ENERGY

[75] Inventors: Heinz Lienhard, Zug; Jan Petr, Oberwil, both of Switzerland

[73] Assignee: LGZ Landis & Gyr Zug AG, Zug, Switzerland

[21] Appl. No.: 332,218

[22] Filed: Dec. 18, 1981

[30] Foreign Application Priority Data

Dec. 24, 1980 [CH] Switzerland .................... 9569/80

[51] Int. Cl.³ ............... G01R 21/06; G01R 33/00; G01R 33/02

[52] U.S. Cl. .................... 324/142; 324/117 R; 324/252

[58] Field of Search ............ 324/142, 252, 117 H, 324/117 R

[56] References Cited

FOREIGN PATENT DOCUMENTS 1247179 10/1960 France ................... 324/117 H

OTHER PUBLICATIONS

Wieder, H. H., "Hall Generators and Magnetoresistors; Pion Limited, London; pp. 69, 70, 74, 75, 76, 77, 85, 86, 87, 88, 89, 90, 91, 92.
Bajorek et al., "A Permalloy Current Sensor; IEEE Trans. on Magnetics; vol. MAG-12; No. 6; Nov. 1976; pp. 813–815.
Bajorek et al., "Magnetoresistive Current Sensor"; IBM Tech. Dis. Bull.; vol. 18; No. 8; Jan. 1976; pp. 2745–2748.

Primary Examiner—Ernest F. Karlsen
Attorney, Agent, or Firm—Ernest F. Marmorek

[57] ABSTRACT

In an apparatus for the measurement of electrical power, including a multiplier which receives on an input thereof an electrical signal proportional to the voltage component of the electrical power, and which is subjected to an external magnetic field proportional to the current component of the electrical power, an auxiliary magnetic field is applied to the multiplier. The multiplier is a Wheatstone bridge including four ferromagnetic and magnetoresistive thin films, and the magnetic fields have a direction along the direction of the hard magnetic axes of each of the thin films. The thin films are so positioned that the magnetization of two electrically oppositely disposed thin films resulting from the application of the external magnetic field thereto is rotated in a direction opposite to that of the correspondingly resulting magnetization of the remaining thin films, following application of the auxiliary magnetic field to the films.

10 Claims, 5 Drawing Figures

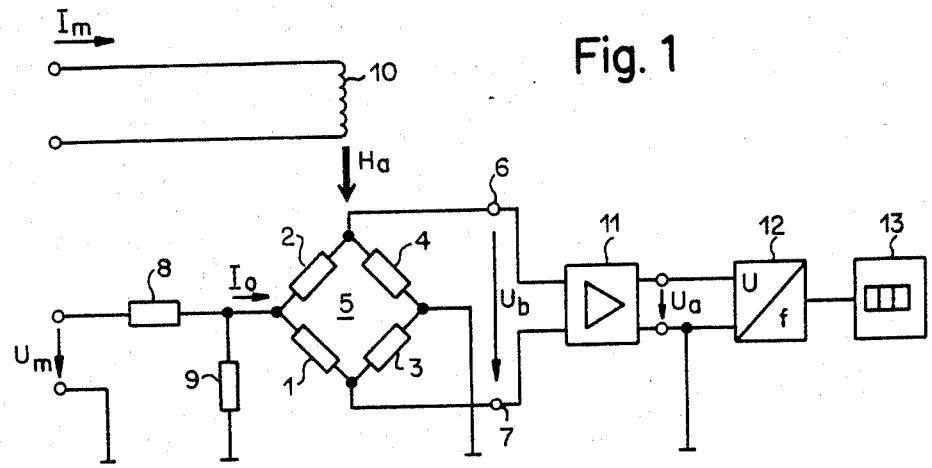
Fig. 1
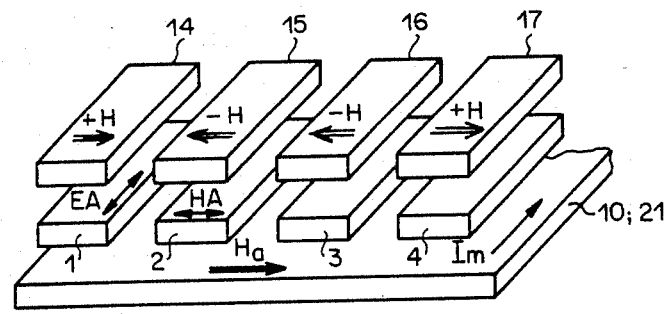
Fig. 2
Fig. 3 Fig. 4
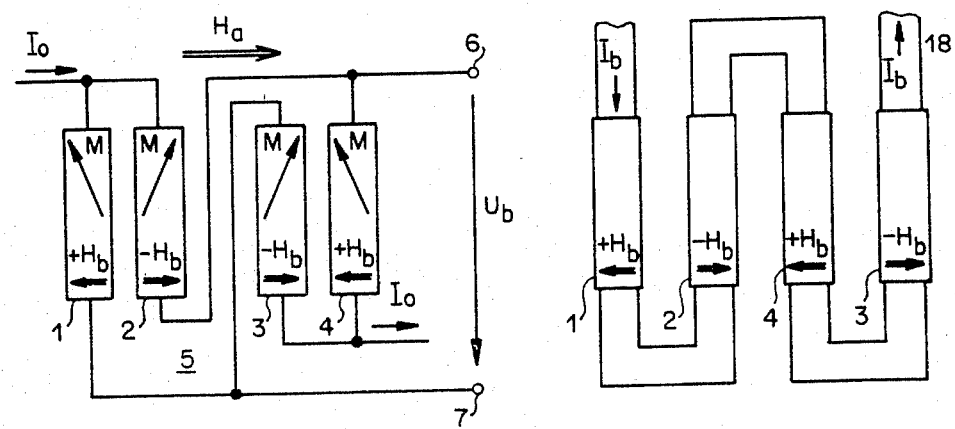

SYSTEM FOR MEASURING ELECTRICAL OUTPUT OR ENERGY

CROSS-REFERENCE TO COPENDING APPLICATIONS

Reference should also be made to copending application Ser. No. 188,339, filed on Sept. 18, 1980, now U.S. Pat. No. 4,385,273, entitled "Transducer for Measuring a Current-Generated Magnetic Field" and copending application entitled "Magnetoresistive Current Detector," and "Compensated Current Transducer," filed concurrently, in all of which one of the applicants of the present application is a coinventor, and which are assigned to the same assignee as the present invention.

BACKGROUND OF THE INVENTION

From H. H. Wieder, Hall Generators and Magnetoresistors, Pion Limited London 1971, page 86, there is known an apparatus for the measurement of electrical power, including a Hall generator serving as a multiplier, which receives on an input thereof an electrical signal proportional to the voltage component of the electrical power, and which is subjected to an external magnetic field proportional to the current component of the electrical power. The external magnetic field is coupled to the Hall generator through a magnetic core. From pages 74 and 77 of the above-noted reference, a multiplier is also known, which consists of either two voltage sources or resistors, on one hand, and two magnetoresistors on the other hand, connected so as to form a bridge circuit.

In Hall generators and magnetoresistors a galvanomagnetic effect in semiconductors is exploited. A magnetic field to be measured is coupled at a right angles to the main plane of a plate-shaped semiconductor, which is only possible at an adequate efficiency by means of a magnetic core, in a view of the well known low sensitivity of the Hall generators or the magnetoresistors. The considerable dependence on temperature, and poor linearity is a disadvantage of this circuit.

There is further known a current detector for the measurement of a current to be measured in a conductor from the IEEE transactions on magnetics, November 1976 pages 813-815, in which four ferromagnetic magnetoresistor thin film pairs form a bridge. The thin films of each pair are magnetostatically coupled to one another, so that a current flowing in one thin film generates an auxiliary magnetic field in the other thin film. The magnetic external field generated by the current to be measured magnetizes the thin films in the direction of their hard axes. As the intensity of the auxiliary magnetic field depends on the magnitude of the current feeding the bridge, this current detector cannot be used as a multiplier.

SUMMARY OF THE INVENTION

It is an object of the present invention to devise an apparatus for the measurement of electrical power or energy, which is relatively independent of temperature, and which furthermore permits the external magnetic field to be coupled to the multiplier free of any magnetic core.

This object is attained in an apparatus for the measurement of electrical power, including a multiplier which receives on an input thereof an electrical signal proportional to the voltage component of the electrical power, and which is subjected to an external magnetic field proportional to the current component of the electrical power, and which includes, in combination, means for generating an auxiliary magnetic field and for applying it to the multiplier. The multiplier comprises a Wheatstone bridge including four ferromagnetic and magnetoresistive thin films, and the magnetic fields have a direction along the direction of the hard magnetic axes of each of the films. The thin films are so positioned that the magnetization of two electrically oppositely disposed thin films resulting from the application of the external magnetic field thereto is rotated in a direction opposite to that of the correspondingly resulting magnetization of the remaining thin films, following application of the auxiliary magnetic fields to the thin films.

Further objects and advantages of the invention will be set forth in part in the following specification, and in part will be obvious therefrom without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings in which:

FIG. 1 is a block schematic diagram of an electronic wattmeter;

FIG. 2 is a fragmentary exploded view in perspective of the multiplier of the wattmeter;

FIG. 3 is a circuit diagram of a first version of the multiplier;

FIG. 4 is a circuit diagram of a second version of the multiplier; and

DESCRIPTION OF THE PREFERRED EMBODIMENTS

Figure 5:
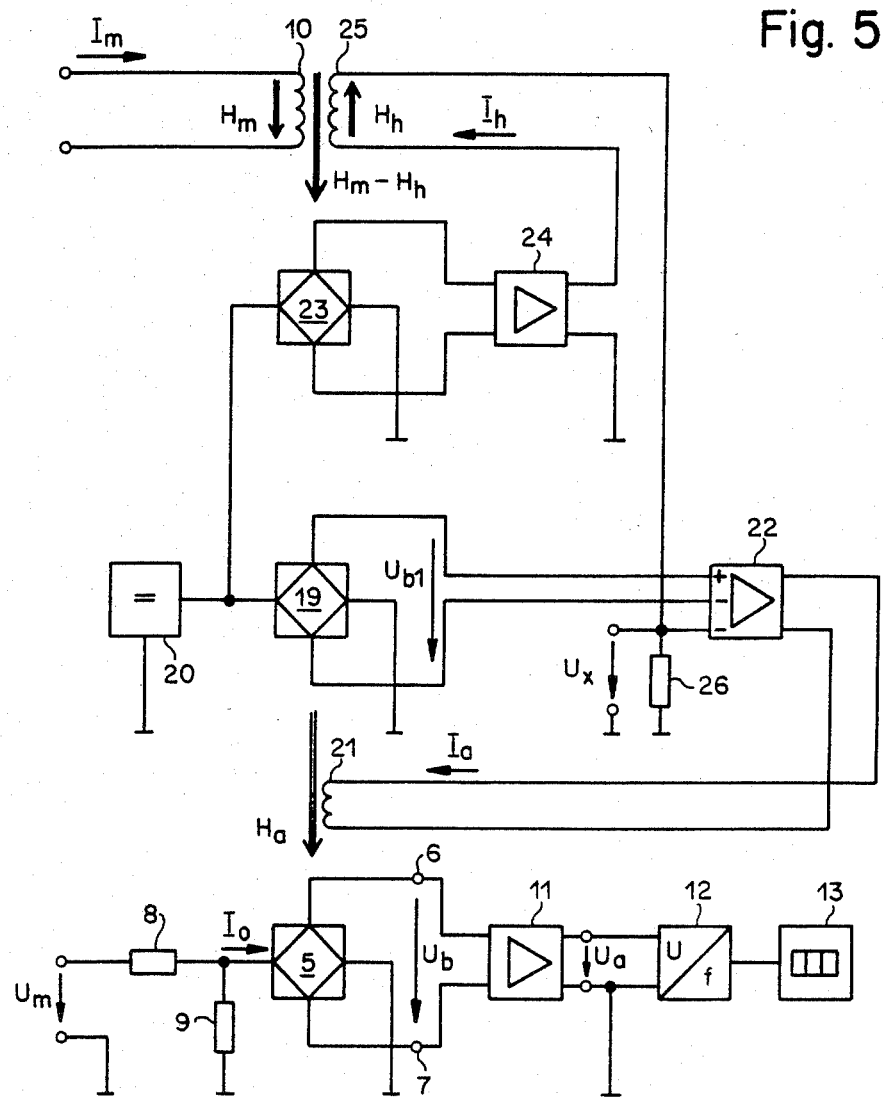
FIG. 5 is a circuit diagram of an alternate version of the electronic wattmeter.

In carrying the invention into affect, and referring now in particular to FIG. 1, four ferromagnetic magnetoresistive thin films 1 through 4 form an electrical Wheatstone bridge 5. The bridge 5 acts as a multiplier, having output terminals 6 and 7, and has an input thereof connected through a divider consisting of resistors 8 and 9 to a measurement voltage $U_m$, so that a current $I_o$ flows into the bridge 5, which is proportional to the voltage component of the electrical power, which is to be measured. The current component $I_m$ of the electrical power, which is to be measured, flows in an electrical conductor 10, and generates an external magnetic field $H_a$, to which the thin magnetic films 1 through 4 are subjected free of any magnetic core. The bridge voltage $U_b$ obtained on the output terminals 6 and 7 is fed to the input of a difference amplifier 11, which amplifies the bridge voltage $U_b$ at a constant amplification factor, so that an output voltage $U_a$ is obtained therefrom, which is fed to a voltage-to-frequency converter 12. A counter 13 counts the output pulses of the voltage-to-frequency converter 12.

In FIG. 2, which is not drawn to scale, the thin films 1 through 4 are disposed in a common plane. Below the thin films 1 through 4 there is disposed a substantially flat conductor 10, in which the current $I_m$ to be measured flows. Above the thin films 1 through 4, and superimposed thereon, there are disposed in a common plane four permanent magnetic layers 14 through 17.

The conductor 10, the thin films 1 through, 4 and the layers 14 through 17 are separated from one another by (non-illustrated) insulating layers.

The current $I_m$ to be measured flows in the conductor 10 along the direction of the easy axes EA of the thin films 1 through 4. It is advantageous if a substantially flat conductor or flat coil is employed as a conductor 10, and if the thin films 1 through 4 of the Wheatstone bridge 5 are disposed in a zone in which the external magnetic field $H_a$ generated by the current $I_m$ to be measured is homogenous, the thin films 1 through 4 being magnetized thereby along a direction of their hard magnetic axes HA. As the thin films 1 through 4, and the conductor 10 are disposed very close to one another in respective parallel planes, they need only be insulated from one another by a thin layer, the magnetic coupling of the external magnetic field $H_a$ to the thin films 1 through 4 being effected at a high efficiency free of any magnetic core, so that a conventional magnetic core can be omitted in the construction, according to the present invention.

According to FIG. 3, the topmost or rearmost ends of the thin films 1 and 2 are connected to the junction of the resistors 8 and 9, and the two lowermost or front ends of the thin films 3 and 4 are connected to ground, as can be seen from FIG. 1, so that a current $I_o$ flows through the Wheatstone bridge 5. The lowermost or front end of the thin film 2, as well as the topmost or rear end of the thin film 4 are connected to the output terminal 6, and the lowermost or front end of the thin film 1 as well as the topmost or rear end of the thin film 3 are connected to the output terminal 7 of the Wheatstone bridge 5.

As seen in FIG. 2, the rightwardly directed magnetization +H of the permanent magnetic layer 14 generates in the thin film 1 disposed thereabove (or therebelow) a leftwardly directed auxiliary field $+H_b$, as can be seen from FIG. 3, resulting in the magnetizing vector M in the thin film 1 being rotated counterclockwise by a predetermined angle from the easy magnetic axis EA. In analogous manner, as a result of the magnetization +H of the layer 17 in the thin film 4, there is generated an auxiliary magnetic field $+H_b$ and a rotation of the magnetizing vector M in a counterclockwise direction. The magnetization −H of the layers 15 and 16 cause in the thin films 2 and 3 an auxiliary magnetic field directed rightwardly of a magnitude $-H_b$, and a rotation of the magnetizing vector M in a clockwise direction. The auxiliary magnetic fields $+H_b$ and $-H_b$ are therefore applied in a direction of the hard magnetic axes HA in such a manner that the magnetization in the thin films 1 and 4 in relation to the magnetization of the electrically immediately adjoining thin films 2 and 3 are in respective opposite directions. The resulting change of resistance due to this rotation is equal in all thin films 1 through 4, and the Wheatstone bridge 5 thus remains in equilibrium.

As soon as the Wheatstone bridge 5 is subjected to the magnetic external field $H_a$, the electrical resistance in the differently premagnetized thin films 1 through 4 changes accordingly and an output bridge voltage $U_b$ results.

Within the permissible control range which is limited by a thin film of the thin film pairs 1 and 2, on one hand, and 3 and 4, on the other hand, being saturated, the following relation applies:

$$U_b = \frac{2 \cdot \Delta R}{(1 + \gamma)^2} \cdot I_o \cdot h_b \cdot h_a,$$

where
$\Delta R$ = maximum resistance change of the thin films $$\gamma = \frac{N \cdot M_s}{H_k}$$

A normalized demagnetization factor.
N demagnetizing factor in the thin films
$M_s$ the saturation magnetization
$H_k$ the anisotropic field strength.

$$h_b = \frac{H_b}{H_k}$$

$$h_a = \frac{H_a}{H_k}$$

The output voltage $U_b$ is therefore proportional both to the current $I_o$, as well as to the external field $H_a$, and therefore to the product $U_m \cdot I_m$. At the output of the difference amplifier 11 there occurs therefore a voltage $U_a$ referred to the zero potential, and galvanically separated from the conductor 10, which is a measure of the electrical output or watts generated, and the electrical energy can be obtained from the counter 13. Compared to multipliers consisting of Hall generators or magnetoresistors, the formation of the product $U_m \cdot I_m$ has a far lower temperature dependence.

The intensity of the auxiliary magnetic fields $H_b$ must be constant, and therefore independent of the current $I_o$, as it shows up directly in the measurement result. The output voltage of the Wheatstone bridge $U_b$, and therefore the measurement accuracy attainable thereby are greatest if $$h_b = \frac{1 + \gamma}{2}$$

According to FIG. 4, the generation of the auxiliary magnetic field $H_b$ can be accomplished by means of a conductor or conductive loop 18, which is disposed below the permanently magnetized layers 14 through 17 directly below or above the thin films 1 through 4, and is insulated therefrom, and through which an auxiliary current $I_b$ passes.

The voltage-to-frequency convertor 12 can operate according to the known process of periodic polarity switching, well known by its high accuracy and supression of zero position errors. The required periodic switching of the sign of the multiplication process can be accomplished by means of an analog switch, which, for example, switches over the polarity of the current $I_o$, of the auxiliary current $I_b$, or of the Wheatstone bridge output voltage $U_b$.

In FIG. 5 the same parts have been designated with the same reference numerals as those of FIG. 1. In addition to the Wheatstone bridge 5 there is provided a second similar bridge 19, which is fed by a current- or voltage-source 20, and subjected together with the Wheatstone bridge 5 to the magnetic external field $H_a$. This external magnetic field $H_a$, though proportional to the current $I_m$ to be measured, as well as to the input voltage $U_x$ is not, however, generated directly by the current $I_m$ to be measured, but by a current $I_a$ flowing in the conductor or conducting loop 21. Thus the conducting loop 21 in FIG. 2 takes the place of the conductor 10. The output of the Wheatstone bridge 19 is connected to the input of a difference amplifier 22, which has a very high amplification factor. A further input of the difference amplifier 22 receives the voltage $U_x$, which is proportional to the current $I_m$ to be measured.

The Wheatstone bridge 19, the difference amplifier 22, and the conducting loop 21 form a control loop, which regulates the external magnetic field $H_a$ in such a manner, that the difference between the output voltage $U_{b1}$ of the Wheatstone bridge 19, and the input voltage $U_x$ becomes minimum, so that an external magnetic field $H_a$, which is proportional to the input voltage $U_x$ is generated, provided the Wheatstone bridge 19 is supplied at a constant current. At the output of the difference amplifier 11 there is obtained a voltage $U_a$ proportional to the product $U_x \cdot U_m$. Any non-linearities of the Wheatstone bridges 5 and 19 in dependence of the external magnetic field $H_a$ are mutually compensated, so that only the difference of any linearity errors of the bridges can show up in the measurement result.

A conventional current convertor can be employed to generate the input voltage $U_x$ from the current $I_m$ to be measured, while galvanically separating both circuits. It is advantageous if a third Wheatstone bridge 23 is used therefor, which is similar to the Wheatstone bridges 5 and 19, and which is also fed by the current- or voltage-source 20. The bridge 23 is subjected to a primary magnetic field $H_m$ as well as a compensating magnetic field $H_h$, compensating the primary magnetic field $H_m$. The primary or measurement magnetic field $H_m$ is generated by the current $I_m$ to be measured in the electrical conductor 10. The output of the Wheatstone bridge 23 is connected to a difference amplifier 24, which has a very high amplification factor, and whose output is connected to a conducting element or loop 25. In series with the conducting loop 25 there is connected a resistor 26, across which there is obtained the input voltage $U_x$.

The compensating current $I_h$ flowing in the conducting loop 25 generates the compensating magnetic field $H_h$. As a result of the action of the Wheatstone bridge 23, the difference amplifier 24, and the conducting loop 25, the resulting control loop regulates the compensating current $I_h$ in such a manner that the difference between the primary magnetic field $H_m$ and the compensating magnetic field $H_h$ is minimal, so that $I_h = I_m$. In view of the Wheatstone bridge 23 being subjected to the difference field $H_m - H_h$ resulting substantially in the maintenance of the zero point, the proportionality between the input voltage $U_x$ and the current $I_m$ to be measured is not impaired by any linearity errors of the Wheatstone bridge 23.

The electronic electricity- or watt-meter, according to FIG. 5, has a particularly high measurement accuracy as a result of the two control loops. Although at first blush it may appear expensive to manufacture, this is, however, not the case, as magnetic cores can be dispensed with, and as the thin films of the Wheatstone bridges 5, 19, and 23, the electronic components, and the loops 21 and 25, if necessary, formed by thin film loops, can be manufactured as integrated circuits, and accommodated on a single substrate or semiconductor plate.

We wish it to be understood that we do not desire to be limited to the exact details of construction shown and described, for obvious modifications will occur to a person skilled in the art.

Having thus described the invention, what we claim as new and desire to be secured by Letters Patent is as follows:

1. An apparatus for the measurement of electrical power including a multiplier receiving on an input thereof an electrical signal proportional to the voltage component of said electrical power, and being subjected to an external magnetic field proportional to the current component of said electrical power, comprising, in combination, a substantially flat electrical conductor disposed in a first plane, carrying a current proportional to said current component, and generating said external magnetic field;

said multiplier comprising a Wheatstone bridge including four ferromagnetic and magnetoresistive thin films having hard and easy axes, respectively, said thin films being disposed in a second plane substantially parallel to said first plane, and being coupled to said external magnetic field free of any magnetic core, said hard magnetic axes of each of said thin films extending along the direction of said external magnetic field, said thin films being electrically so interconnected as to form two pairs of electrically oppositely disposed thin films; and means for generating auxiliary magnetic fields, and for applying said auxiliary magnetic fields to said multiplier, said means being so positioned, in relation to said thin films, that said auxiliary magnetic fields extend along said directions of the hard magnetic axes of said thin films, whereby, following the application of said auxiliary magnetic fields to said thin films, the magnetization of one of said two pairs of electrically oppositely disposed thin films resulting from the application of said external magnetic field thereto is rotated in a direction opposite to that of a correspondingly resulting magnetization of the other pair of electrically oppositely disposed thin films.

2. The apparatus as claimed in claim 1, wherein said auxiliary magnetic field is independent of said electrical signal.

3. The apparatus as claimed in claim 1, further including an electrically conducting member generating said auxiliary magnetic field.

4. An apparatus as claimed in claim 1, further comprising permanent magnetic layer means generating said auxiliary field.

5. An apparatus for the measurement of electrical power including a multiplier receiving on an input thereof an electrical signal proportional to the voltage component of said electrical power, and being subjected to an external magnetic field proportional to the current component of said electrical power, comprising, in combination, a substantially flat electrical conductor disposed in a first plane, carrying a current proportional to said current component, and generating said external magnetic field;

said multiplier comprising a wheatstone bridge including four ferromagnetic and magnetoresistive thin films having hard and easy axes, respectively, said thin films being disposed in a second plane substantially parallel to said first plane, and being coupled to said external magnetic field free of any magnetic core, said hard magnetic axes of each of said thin films extending along the direction of said external magnetic field, said thin films being electrically so interconnected to form two pairs of electrically oppositely disposed thin films;

means for generating auxiliary magnetic fields, and for applying said auxiliary magnetic fields to said multiplier, said means being so positioned, in relation to said thin films, that said auxiliary magnetic fields extend along said directions of the hard magnetic axes of said thin films, whereby, following the application of said auxiliary magnetic fields to said thin films, the magnetization of one of said two pairs of electrically oppositely disposed thin films resulting from the application of said external magnetic field thereto is rotated in a direction opposite to that of a correspondingly resulting magnetization of the other pair of electrically oppositely disposed thin films;

a second Wheatstone bridge adapted to be fed from an electrical signal source and being subjected to said external magnetic field; and a difference amplifier having a first input connected to the output of said second Wheatstone bridge, and a second input receiving a second electrical signal proportional to said current component, the output of said difference amplifier being connected to said electrically conducting element, so that any non-linearities of said Wheatstone bridges due to said external magnetic field are substantially cancelled.

6. The apparatus as claimed in claim 5, wherein said electrical signal source is a current source.

7. The apparatus as claimed in claim 5, wherein said electrical signal source is a voltage source.

8. An apparatus for the measurement of electrical power including a multiplier receiving on an input thereof an electrical signal proportional to the voltage component of said electrical power, and being subjected to an external magnetic field proportional to the current component of said electrical power, comprising, in combination, a substantially flat electrical conductor disposed in a first plane, carrying a current proportional to said current component, and generating said external magnetic field;

said multiplier comprising a wheatstone bridge including four ferromagnetic and magnetoresistive thin films having hard and easy axes, respectively, said thin films being disposed in a second plane substantially parallel to said first plane, and being coupled to said external magnetic field free of any magnetic core, said hard magnetic axes of each of said thin films extending along the direction of said external magnetic field, said thin films being electrically so interconnected to form two pairs of electrically oppositely disposed thin films; and means for generating auxiliary magnetic fields, and for applying said auxiliary magnetic fields to said multiplier, said means being so positioned, in relation to said thin films, that said auxiliary magnetic fields extend along said directions of the hard magnetic axes of said thin films, whereby, following the application of said auxiliary magnetic fields to said thin films, the magnetization of one of said two pairs of electrically oppositely disposed thin films resulting from the application of said external magnetic field thereto is rotated in a direction opposite to that of a correspondingly resulting magnetization of the other pair of electrically oppositely disposed thin films;

a second Wheatstone bridge adapted to be fed from an electrical signal source and being subjected to said external magnetic field;

a difference amplifier having a first input connected to the output of said second Wheatstone bridge, and a second input receiving a second electrical signal proportional to said current component, the output of said difference amplifier being connected to said electrically conducting element, so that any non-linearities of said Wheatstone bridges due to said external magnetic field are substantially cancelled;

a second electrically conducting element carrying a current generating a compensating magnetic field;

a third Wheatstone bridge adapted to be fed from said electrical signal source and subjected to said external magnetic field and to said compensating magnetic field free of any magnetic core; and a second difference amplifier having an input connected to the output of said third Wheatstone bridge, said second conducting element being connected to the output of said second difference amplifier.

9. The apparatus as claimed in claim 8, wherein said electrical signal source is a current source.

10. The apparatus as claimed in claim 8, wherein said electrical signal source is a voltage source.

* * * * *